(12) United States Patent
Ohshima et al.

(10) Patent No.: US 7,482,275 B2
(45) Date of Patent: Jan. 27, 2009

(54) PLASMA TREATMENT METHOD AND METHOD OF MANUFACTURING SEMICONDUCTOR DEVICE

(75) Inventors: Keiji Ohshima, Kanagawa (JP); Takahiro Saito, Kanagawa (JP); Kazunori Nagahata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/276,780

(22) Filed: Mar. 14, 2006

(65) Prior Publication Data
US 2006/0216432 A1     Sep. 28, 2006

(30) Foreign Application Priority Data
Mar. 22, 2005   (JP)   ............................ P2005-081213
Dec. 1, 2005    (JP)   ............................ P2005-347999

(51) Int. Cl.
*H01L 21/302* (2006.01)
(52) U.S. Cl. ........................................ 438/689; 438/702

(58) Field of Classification Search ................. 438/689, 438/702, 706, 712, 723, 724
See application file for complete search history.

(56) References Cited

U.S. PATENT DOCUMENTS

| | | | | |
|---|---|---|---|---|
| 5,902,122 | A | * | 5/1999 | Sheen et al. ................. 438/224 |
| 6,028,015 | A | * | 2/2000 | Wang et al. .................. 438/789 |
| 6,114,259 | A | * | 9/2000 | Sukharev et al. ............ 438/789 |
| 6,284,657 | B1 | * | 9/2001 | Chooi et al. ................. 438/687 |
| 6,346,490 | B1 | * | 2/2002 | Catabay et al. .............. 438/795 |
| 6,521,545 | B1 | * | 2/2003 | Yang et al. .................. 438/763 |
| 6,962,869 | B1 | * | 11/2005 | Bao et al. .................... 438/623 |
| 2002/0132383 | A1 | * | 9/2002 | Hiroki et al. .................. 438/17 |
| 2002/0164877 | A1 | * | 11/2002 | Catabay et al. .............. 438/694 |
| 2005/0118541 | A1 | * | 6/2005 | Ahn et al. .................... 430/464 |

* cited by examiner

*Primary Examiner*—Kin-Chan Chen
(74) *Attorney, Agent, or Firm*—Sonnenschein Nath & Rosenthal LLP

(57) ABSTRACT

An insulation film on a substrate is subjected to a plasma treatment using a gas containing at least either of a CH-based gas and a CO-based gas, whereby variations in the dielectric constant of the insulation film and adsorption of water onto the insulation film can be suppressed.

5 Claims, 12 Drawing Sheets

PLASMA TREATMENT METHOD AND METHOD OF MANUFACTURING SEMICONDUCTOR DEVICE

CROSS REFERENCES TO RELATED APPLICATIONS

The present invention contains subject matter related to Japanese Patent Application JP 2005-081213 filed in the Japanese Patent Office on Mar. 22, 2005, and Japanese Patent Application JP 2005-347999 filed in the Japanese Patent Office on Dec. 1, 2005, the entire contents of which being incorporated herein by reference.

BACKGROUND OF THE INVENTION

The present invention relates to a plasma treatment method and a method of manufacturing a semiconductor device, and particularly to a plasma treatment method for treating a surface of an insulation film and a method of manufacturing a semiconductor device by applying the plasma treatment method.

In recent years, attendant on the increase in the degree of integration of semiconductor integrated circuit devices (LSI), the wiring process technology has been becoming more and more important in relation to high-speed operations of the LSI. This is because it has come to be conspicuous that the wiring delay time is greater than the gate delay time due to the miniaturization of semiconductor devices.

For suppressing the wiring delay time, it may be necessary to reduce the capacitance between wirings or to lower the wiring resistance. In addition, since the miniaturization of semiconductor devices is attended by an increase in current density, an enhanced countermeasure against electro migration (EM) may also be needed. Then, it is considered that, for meeting these requirements, it is important to introduce of a multi-layer wiring technology in which a copper (Cu) wiring and a low dielectric constant layer insulation film are used.

The Cu wiring shows an electric resistance of about ⅔ times that of an aluminum alloy wiring according to the system in related art. Therefore, Cu is a material with which a reduction in wiring resistance can be realized. In addition, Cu is a material which promises a higher electro migration durability than that of the Al alloy wiring. Therefore, introduction of the Cu wiring into practical products has already begun.

As a method for forming a Cu wiring, the Damascene process is generally used. A method of forming a Cu wiring by use of the Damascene process will be described below. First, a trench is formed in a layer insulation film such as an $SiO_2$ film by application of a photolithography technique and an etching technique. Thereafter, an opening portion is formed in a stopper layer for connection between a lower-layer wiring and a contact. Then, a barrier metal film for preventing diffusion of Cu into the inside of the layer insulation film inclusive of the inside of the trench is formed, in the manner of filling up the trench with Cu. Thereafter, the surplus Cu film on the layer insulation film is removed by use of a CMP (Chemical Mechanical Polishing) process or the like. As a result, the Cu wiring by use of the Damascene process is completed.

In order to reduce the capacitance between wirings in the Cu wiring as above-mentioned, an SiOCH film, an SiOF film, organic insulation films and the like which are lower in dielectric constant than a silicon oxide ($SiO_2$) film have been being developed and put to practical use as a layer insulation film.

The low dielectric constant film as above can be obtained by lowering the polarizability of the material, but the use of only the lowering of polarizability has a limit. In view of this, it is considered to be necessary to lower the dielectric constant by making the film porous in structure. Recently, attention has been paid to the development of a low dielectric constant film obtained by making porous a film of a low dielectric constant material.

SUMMARY OF THE INVENTION

However, when an insulation film such as an oxide film of TEOS or the like, a low dielectric constant film and an organic insulation film to be used as the above-mentioned layer insulation film is subjected to a processing treatment for forming trenches and contact holes, there arises the problem that the processed surface is highly hygroscopic (see, for example, K. Yatsuda et al., "Quantitative Control of Plasma-Surface Interactions for Highly Reliable Interconnects"). The reason why the processed surface is highly hygroscopic is considered to lie in that dangling bonds are generated in the processed surface, and water and the like are adsorbed on the dangling bonds. Hereinafter, the processed surface having become highly hygroscopic will be referred to as "the denatured surface". Or, among oxide based insulation films, there are those which are highly hygroscopic even in an unprocessed state.

When water is absorbed in the insulation film, the remaining water or the like will be released as gas at the later time of forming a buried Cu wiring. As a result, deterioration of a barrier metal layer, lowering in the adhesion of the barrier metal layer, defective burying of Cu, or the like is caused, whereby electrical characteristics are worsened. This problem becomes further conspicuous when a porous film is used as the low dielectric constant film. The reason lies in that a porous film has a large surface area and, hence, a high moisture absorption.

Besides, where dangling bonds are present in the surface of the insulation film, the surface would have a dielectric constant different from the intrinsic dielectric constant of the insulation film. In addition, when water is adsorbed on the dangling bonds possessed by the insulation film, the dielectric constant is raised from the value intrinsic of the insulation film. As a result, the characteristics of the low dielectric constant film are lowered.

Thus, there is a need to provide a plasma treatment method by which variations in the dielectric constant of an insulation film and adsorption of water on the insulation film can be suppressed.

There is another need to provide a method of manufacturing a semiconductor device by which variations in the dielectric constant of a layer insulation film and adsorption of water on the layer insulation film can be suppressed by subjecting the surface of the layer insulation film to a plasma treatment and a higher reliability can thereby be contrived.

According to an embodiment of the present invention, there is provided a plasma treatment method wherein an insulation film on a substrate is subjected to a plasma treatment using a gas containing at least either of a CH-based gas and a CO-based gas.

In the plasma treatment method according to the present invention, the plasma treatment using a gas containing at least either of a CH-based gas and a CO-based gas is applied to the insulation film, whereby C and H are supplied to the surface of the insulation film.

According to another embodiment of the present invention, there is provided a method of manufacturing a semiconductor device, including the steps of: forming a layer insulation film on a substrate; forming an opening portion in the layer insulation film; and subjecting a surface of the layer insulation film to a plasma treatment using a gas containing at least either of a CH-based gas and a CO-based gas.

According to a further embodiment of the present invention, there is provided a method of manufacturing a semiconductor device, including the steps of: forming a layer insulation film on a substrate; subjecting a surface of the layer insulation film to a plasma treatment using a gas containing either of a CH-based gas and a CO-based gas; and forming an opening portion in the layer insulation film.

According to the plasma treatment method of the present invention, variations in the dielectric constant of an insulation film and adsorption of water on the insulation film can be suppressed.

According to the methods of manufacturing a semiconductor device of the present invention, by subjecting the surface of a layer insulation film to the plasma treatment, it is possible to suppress variations in the dielectric constant of the insulation film and adsorption of water onto the insulation film and to manufacture a semiconductor device enhanced in reliability.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
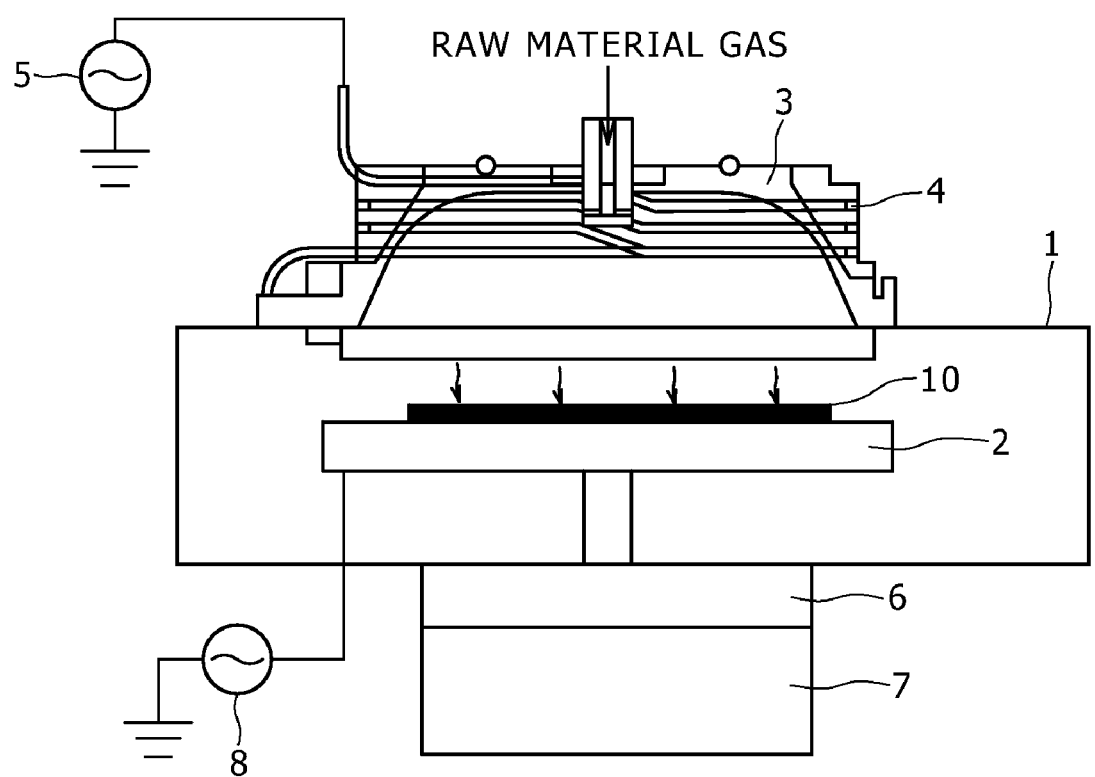
FIG. 1 shows an example of a plasma treatment apparatus for carrying out a plasma treatment method according to a first embodiment of the present invention.

Now, some embodiments of the present invention will be described below referring to the drawings.

First Embodiment

FIG. 1 shows an example of an apparatus for carrying out a plasma treatment according to this embodiment.

In a treatment chamber 1, an electrode 2 for holding a substrate 10 is disposed. On the upper side of the treatment chamber 1, a gas supply unit 3 for supplying a raw material gas to be described later is disposed. An RF coil 4 for producing a plasma of the raw material gas is wound around the gas supply unit 3. The RF coil 4 is connected to an RF power supply 5 for impressing a high-frequency voltage (RF bias). The RF power supply 5 impresses an RF bias of 13.56 MHz, for example.

On the lower side of the treatment chamber 1, an evacuation pump 7 is provided, with a valve 6 therebetween. The electrode 2 is connected to an RF power supply 8. Impressing an RF bias on the electrode 2 produces a plasma, and ions in the plasma are attracted into the substrate 10. The RF power supply 8 impresses an RF bias of 13.56 MH, for example.

In the apparatus configured as above, the RF power supply 5 for producing the plasma and the RF power supply 8 for attracting the ions in the plasma into the substrate 10 are provided independently. This apparatus is a plasma treatment apparatus of the ICP (Inductively Coupled Plasma) system, and can be used not only for the plasma treatment according to this embodiment but also for etching of an insulation film and ashing of a resist mask.

Operations of the apparatus configured as above will be described. With an RF bias impressed on the RF coil 4 by the RF power supply 5, a plasma of the raw material gas contained in the gas supply unit 3 is produced. When an RF bias is then impressed on the electrode 2 by the RF power supply 8, the ions in the plasma produced are attracted into the substrate 10 and, hence, the substrate 10 is irradiated with the ions.

Now, the plasma treatment method according to this embodiment will be described below referring to FIGS. 2A to 2F.

Figure 2A:
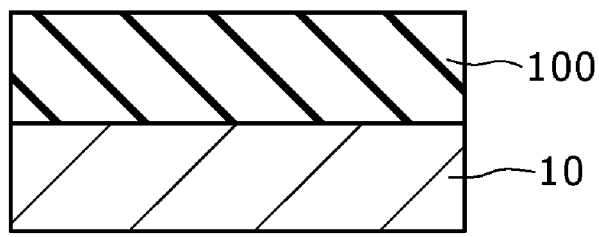
FIGS. 2A to 2F are step sectional diagrams for illustrating a plasma treatment method according to the first embodiment of the present invention.

First, as shown in FIG. 2A, an insulation film 100 is formed on the substrate 10. The material of the insulation film 100 is not particularly limited, insofar as the insulation film has a surface which becomes highly hygroscopic. Examples of the material include an $SiO_2$ film, an SiOF film, an SiOCH film, porous films obtained by making these films porous, and organic insulation films.

Figure 2B:
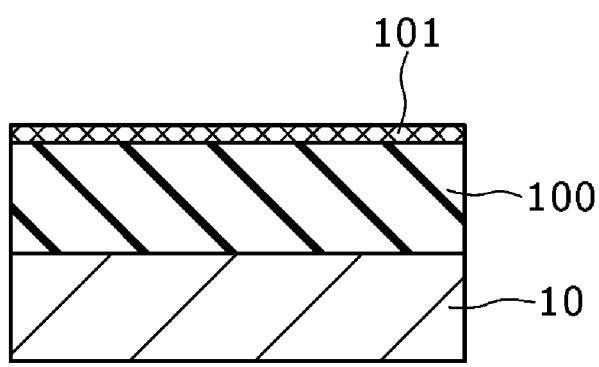

Next, as shown in FIG. 2B, a plasma treatment is applied to the surface of the insulation film 100. The plasma-treated portion is illustrated as the treated portion (treated surface) 101. The treated portion 101 is a layer containing C and H which are captured by the surface of the insulation film 100. In the plasma treatment, a mixed gas containing a CH-based gas and a CO-based gas or a single gas is used as the raw material gas. Examples of the CH-based gas and the CO-based gas include CO, $CO_2$, $C_5H_{12}$, $C_5H_{10}$, $C_4H_{10}$, $C_4H_8$, $C_4H_6$, $C_3H_9N$, $C_3H_8$, $C_3H_6$, $C_3H_4$, $C_2N_2$, $C_2H_7N$, $C_2H_6$, $C_2H_4$, COS, $CH_4S$, $CH_4$, CHN, $CH_5NCHN$, and $CH_5N$.

In the case where dangling bonds are present in the surface of the insulation film 100, C and H are captured by the surface of the insulation film 100 upon the plasma treatment conducted using the gas containing a CH-based gas and a CO-based gas. Therefore, silicon dangling bonds are lost, and the dielectric constant intrinsic of the insulation film is obtained. In addition, the surface of the insulation film 100 thus treated with the plasma has a moisture absorption preventive action. Therefore, adsorption of water is prevented from occurring by the time of the subsequent step.

Figure 2C:
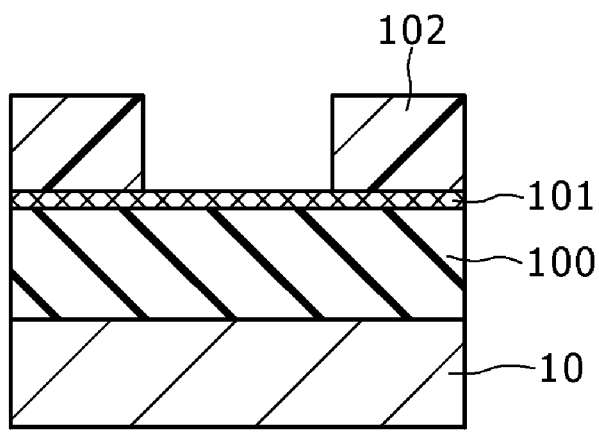

Subsequently, as shown in FIG. 2C, a resist mask 102 is formed on the insulation film 100. The resist mask 102 is formed by resist application, exposure, and development.

Figure 2D:
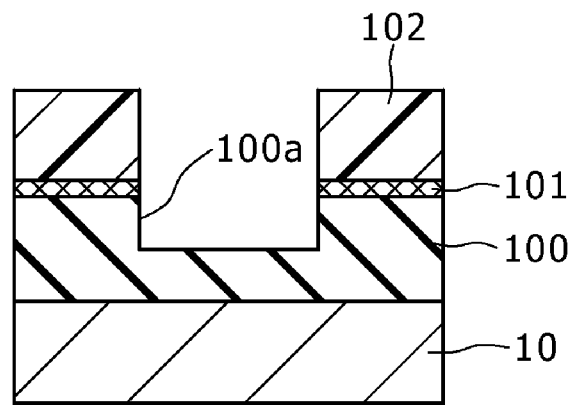

Next, as shown in FIG. 2D, the insulation film 100 is etched by use of the resist mask 102. By this, an opening portion 100a is formed in the insulation film 100. Incidentally, while FIG. 2D shows an example in which the opening portion 100a down to an intermediate depth in the insulation film 100 is formed, an opening portion 100a reaching the substrate 10 may be formed. Besides, a hard mask may be used in place of the resist mask 102.

Figure 2E:
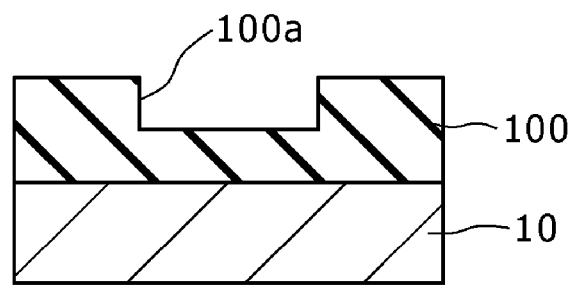

Subsequently, as shown in FIG. 2E, ashing of the resist mask 102 is conducted. The treatment of processing the insulation film 100 and the treatment of ashing the resist mask 102 can be carried out in the apparatus shown in FIG. 1, by changing the raw material gas. For the ashing of the resist mask 102, oxygen gas is used. The ashing results in that the C and H captured by the surface of the insulation film 100 are removed, and silicon dangling bonds are generated again.

Figure 2F:
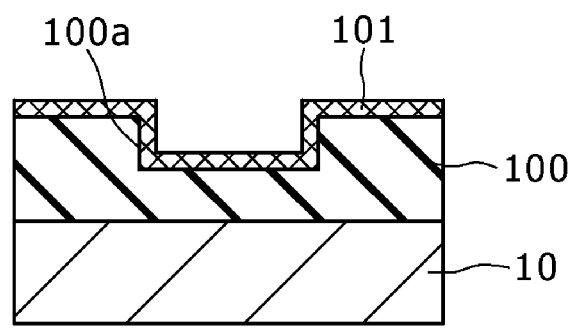

Next, as shown in FIG. 2F, a plasma treatment is applied to the processed surface of the insulation film 100. The plasma-treated portion is illustrated as the treated portion (treated surface) 101. The treated portion 101 is a layer containing C and H which are captured by the surface of the insulation film 100. In the plasma treatment, a mixed gas containing a CH-based gas and a CO-based gas or a single gas is used as the raw material gas. Examples of the CH-based gas and the CO-based gas include $CO$, $CO_2$, $C_5H_{12}$, $C_5H_{10}$, $C_4H_{10}$, $C_4H_8$, $C_4H_6$, $C_3H_9N$, $C_3H_8$, $C_3H_6$, $C_3H_4$, $C_2N_2$, $C_2H_7N$, $C_2H_6$, $C_2H_4$, $COS$, $CH_4S$, $CH_4$, $CHN$, $CH_5NCHN$, and $CH_5N$.

While an example of applying a plasma treatment to the insulation film 100 before and after the processing thereof has been described in the above example, the plasma treatment may be conducted only before the processing or only after the processing, depending on the kind of the insulation film 100 used.

Figure 3:
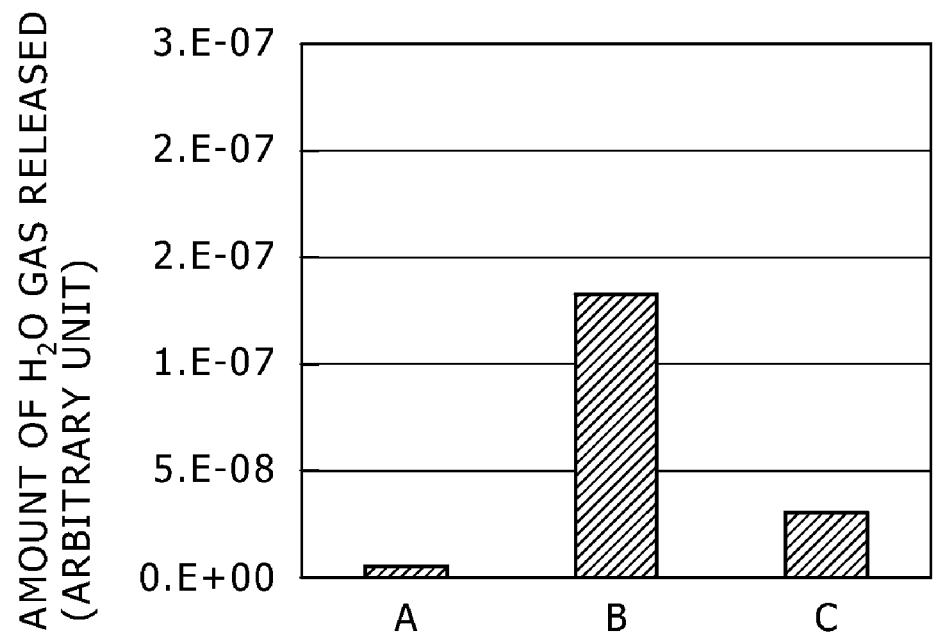
FIG. 3 is a diagram showing the measurement results of the amount of gas released from an insulation film.

FIG. 3 is a diagram showing the results of detection, by a TDS apparatus, of the amount of water vapor ($H_2O$ gas) released from the insulation film 100. In the measurement, the substrate 10 was left to stand in the atmospheric air for 48 hour, then heat was applied to the substrate 10, and the amount of $H_2O$ gas released from the insulation film 100 was detected.

Specimen A is a specimen in which the insulation film 100 on the substrate 10 was not processed. Specimen B is a specimen in which the insulation film 100 was processed by use of an $H_2$ plasma, but was not subjected to the plasma treatment according to this embodiment. Specimen C is a specimen in which the insulation film 100 was processed by use of an $H_2$ plasma, and was then subjected to a plasma treatment using a CH-based gas.

As shown in FIG. 3, the amount of gas released in Specimen C subjected to the plasma treatment is largely reduced, as compared with Specimen B not plasma-treated, and is close to that of Specimen A in which the insulation film 100 was unprocessed.

This indicates that, when the processed surface of the insulation film 100 is subjected to the plasma treatment according to this embodiment, the moisture absorption of the insulation film 100 is markedly reduced.

Figure 4:
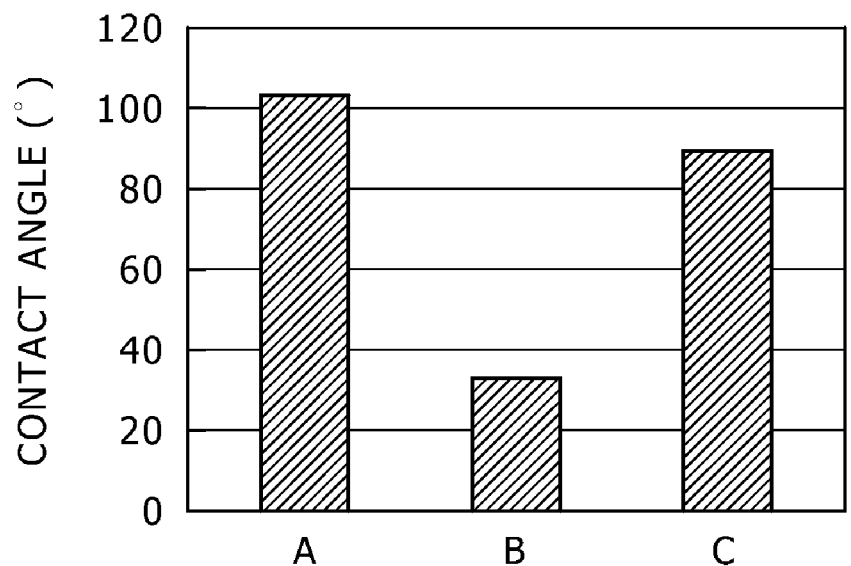
FIG. 4 is a diagram showing the measurement results of contact angle on the insulation film.

FIG. 4 is a diagram showing the results of measurement of contact angle of water against the surface of the insulation film 100. Specimens A to C are the same as described referring to FIG. 3.

As shown in FIG. 4, the contact angle on Specimen C having been plasma-treated is increased, as compared with Specimen B not plasma-treated, and is close to the contact angle on Specimen A in which the insulation film 100 is unprocessed.

The large contact angle indicates that the plasma-treated surface of the insulation film 100 is hydrophobic. Specimen B in which the insulation film 100 was only processed has a small contact angle, which indicates that the surface of the insulation film 100 is hydrophilic. From this it is seen that, when the processed surface of the insulation film 100 is subjected to the plasma treatment according to this embodiment, the processed surface of the insulation film 100 can be returned to be hydrophobic, whereby the moisture absorption can be largely reduced.

As has been described above, according to the plasma treatment method in this embodiment, by subjecting the insulation film 100 to the plasma treatment using the above-mentioned raw material gas, C and H can be captured by the dangling bonds possessed by the insulation film 100. As a result, it is possible to cause the insulation film 100 to restore its intrinsic characteristics (dielectric constant, contact angle). In addition, since the dangling bonds of the insulation film 100 can be lost, adsorption of water onto the insulation film 100 can be prevented from occurring.

This ensures that, in the case of forming a wiring by filling the opening portion 100a in the insulation film 100 with a conductive layer, corrosion of the wiring or lowering in the adhesion due to the release of water having been adsorbed on the insulation film 100 can be prevented, and defective wiring can be obviated. Besides, it is possible to suppress the rise in dielectric constant due to the absorption of moisture into the insulation film 100.

In the plasma treatment as above-mentioned, an RF bias is impressed by the RF power supply 8 provided separately from the RF power supply 5 for producing the plasma, whereby the ions in the plasma are attracted into the opening portion 100a of the insulation film 100, producing a large effect. This is because the capture of ions onto the dangling bonds of the insulation film 100 can be promoted by irradiating the processed surface of the insulation film 100 with the ions in the plasma at a predetermined energy. In addition, the irradiation with the ions at a predetermined energy makes it possible to supply C and H into the opening portion 100a even where the opening portion 100a has a high aspect ratio.

Furthermore, in this embodiment, it is possible to carry out the etching of the insulation film, the ashing of the resist mask, and the plasma treatment in the same apparatus. Therefore, the substrate 10 is not fed through the atmospheric air after the processing of the insulation film 100 and before the plasma treatment. Accordingly, absorption of moisture into the insulation film 100 in such a feeding step can be obviated.

Second Embodiment

In a second embodiment, an example of applying the plasma treatment of the first embodiment to a dual Damascene step in the manufacture of a semiconductor device will be described referring to FIGS. 5A to 5I. In this embodiment, an example in which a contact hole and a wiring trench are adopted as the opening portion formed in the insulation film will be described.

Figure 5A:
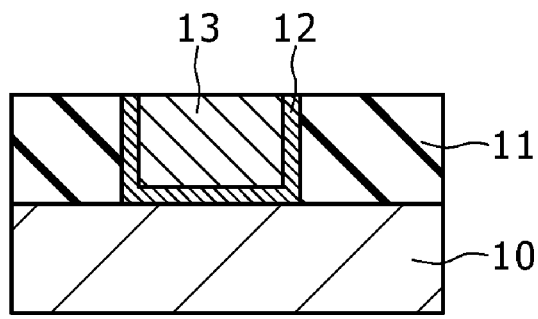
FIGS. 5A and 5I are step sectional diagrams for illustrating a method of manufacturing a semiconductor device according to a second embodiment of the present invention.

As shown in FIG. 5A, a lower layer insulation film 11 composed of SiO2 or the like is formed on a substrate 10, and a lower layer wiring 13 is formed in the lower layer insulation film 11, with a barrier metal layer 12 therebetween. Incidentally, though not shown, the lower layer wiring 13 and the substrate 10 are connected to each other through a contact.

Figure 5B:
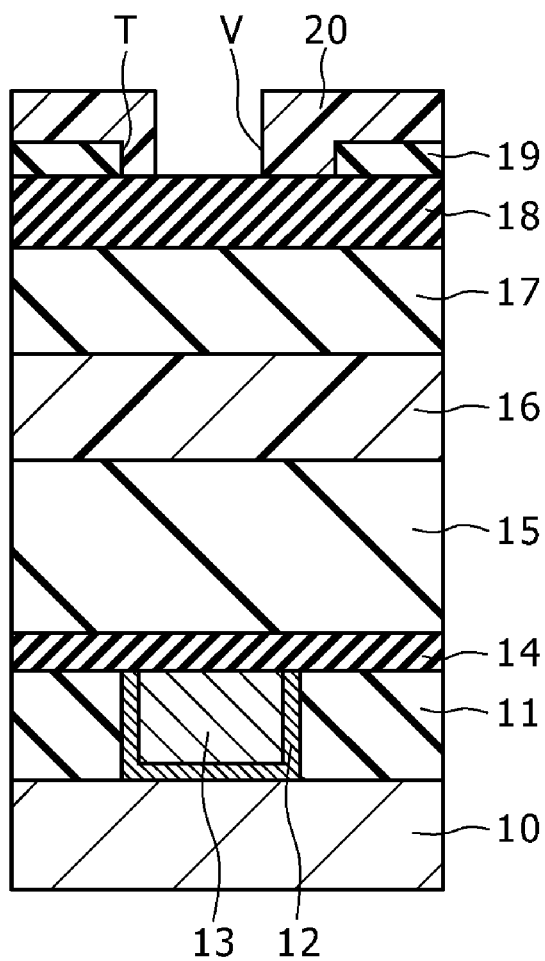

Next, as shown in FIG. 5B, an etching stopper layer 14 composed of an SiC film, for example, is formed on the lower layer wiring 13. While an SiC film is used as the etching stopper layer 14 here, the kind of the film is not particularly limited. Thereafter, a first layer insulation film 15 composed of a porous film, for example, an $SiO_2$ film, an SiOF film, an SiOC film or the like is formed on the etching stopper layer 14, followed by forming a second layer insulation film 16 composed, for example, of an organic insulation film. The first layer insulation film 15 is a layer insulation film to be provided with a contact hole, whereas the second layer insulation film 16 is an insulation film to be provided with a wiring trench. Incidentally, while an example in which the layer insulation film has a two-layer structure composed of the porous film (first layer insulation film 15) and the organic insulation film (second layer insulation film 16) is described here, the structure of the layer insulation film is not particularly limited.

Subsequently, for preventing the release of gas from the porous film and the organic insulation film and for reducing stepped portions at the time of CMP, a cap layer 17 of $SiO_2$ is formed on the second layer insulation film 16. Then, a first hard mask 18 of SiN, for example, and a second hard mask 19 of $SiO_2$, for example, are formed on the cap layer 17 to constitute a hard mask for use in wiring processing. Subsequently, a pattern of a wiring trench T (Trench) is formed in the second hard mask 19 through a photolithography technique and an etching technique. Then, a resist mask 20 provided with a pattern of a contact hole V (Via) is formed through a photolithography technique. After the thus-mentioned assembly is produced, etching is started.

Figure 5C:
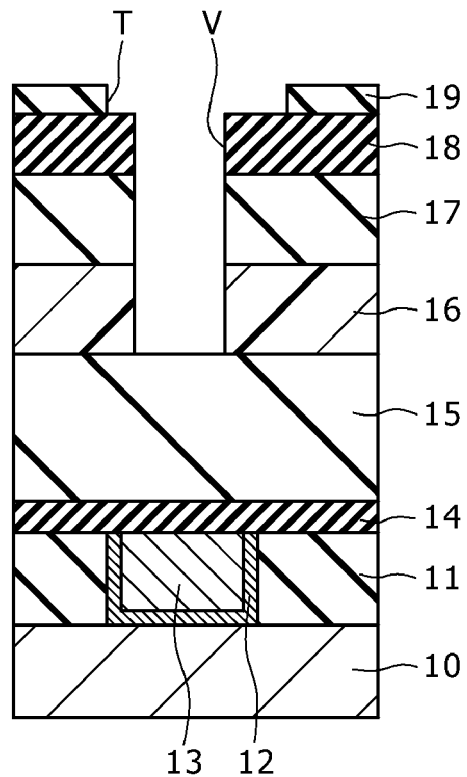

As shown in FIG. 5C, with the resist mask 20 as an etching mask, the first hard mask 18 of SiN, the cap layer 17 of $SiO_2$, and the second layer insulation film 16 composed of an organic insulation film are sequentially etched, to form the contact hole V. In this step, at the time of forming the contact hole V in the second layer insulation film 16 composed of the organic insulation film, the resist mask 20 composed of an organic film is also etched simultaneously, so that there is no need for an ashing step.

Figure 5D:
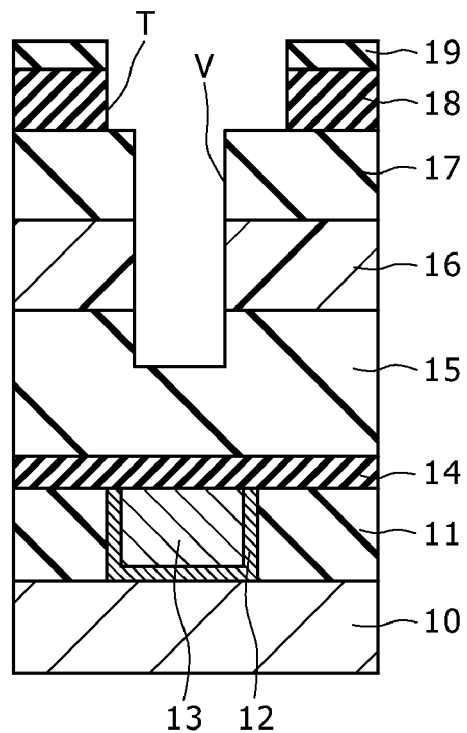

Next, as shown in FIG. 5D, using as an etching mask the second hard mask 19 of $SiO_2$ provided with the pattern of the wiring trench T, the first hard mask 18 is etched, to form the wiring trench T in the first hard mask 18. In this case, the contact hole V is formed down to an intermediate depth in the first layer insulation film 15 composed of the porous film.

Figure 5E:
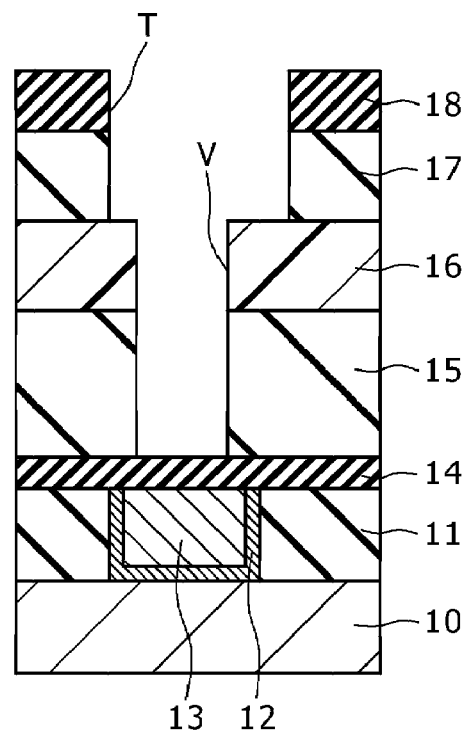

Subsequently, as shown in FIG. 5E, using as an etching mask the first hard mask 18 provided with the pattern of the wiring trench T, the cap layer 17 of $SiO_2$ is etched, to form the wiring trench T in the cap layer 17. In this step, the first layer insulation film 15 composed of an Si-based film like the cap layer 17 is also etched, whereby the contact hole V is formed in the first layer insulation film 15. In addition, by the etching of the cap layer 17 of $SiO_2$, the second hard mask 19 of $SiO_2$ is removed.

Figure 5F:
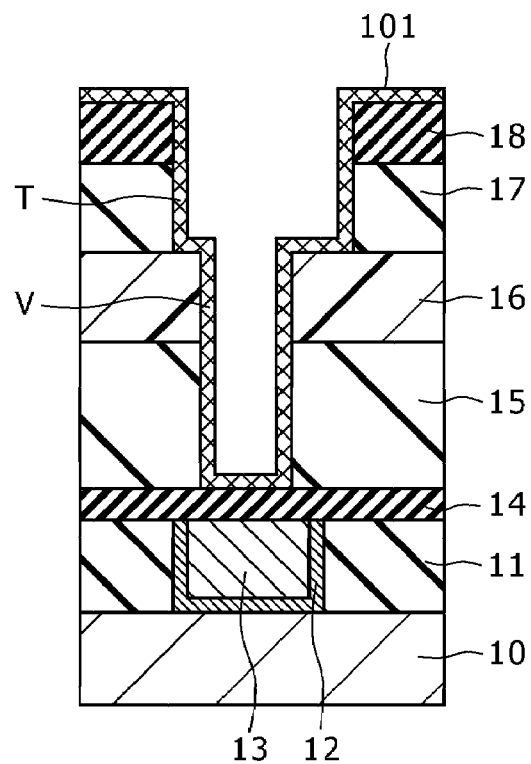

Next, as shown in FIG. 5F, a plasma treatment according to this embodiment is carried out. As a result, C and H are captured by the exposed surfaces of the first layer insulation film 15, the second layer insulation film 16, the cap layer 17, and the first hard mask 18. These surfaces are illustrated as the treated portion 101.

The plasma treatment is the same as described in the first embodiment. As above-mentioned, it is preferable to conduct the plasma treatment in an RF bias impressing type apparatus in which ion energy can be controlled. In addition, for supplying C and H evenly into a contact hole V having a high aspect ratio, it is preferable to conduct the plasma treatment at a low temperature and at a low pressure. As an example, the plasma treatment was conducted under the conditions of a pressure of 2.7 Pa (20 mTorr), an output power of the RF power supply 5 of 800 W, an output power of the RF power supply 8 of 100 W, a flow rate of $CH_4$ as raw material gas of 200 sccm, and a temperature of the electrode 2 of 25° C.

Figure 5G:
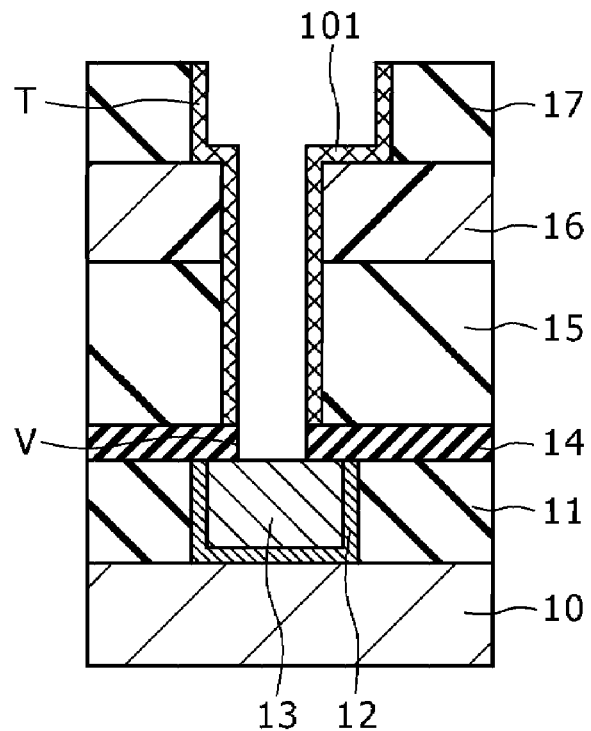

Subsequently, as shown in FIG. 5G, the etching stopper layer 14 exposed at the bottom portion of the contact hole V is etched, to form a pattern of the contact hole V in the etching stopper layer 14. Simultaneously with the etching of the etching stopper layer 14 formed of SiC, the first hard mask 18 of SiN is etched away.

Figure 5H:
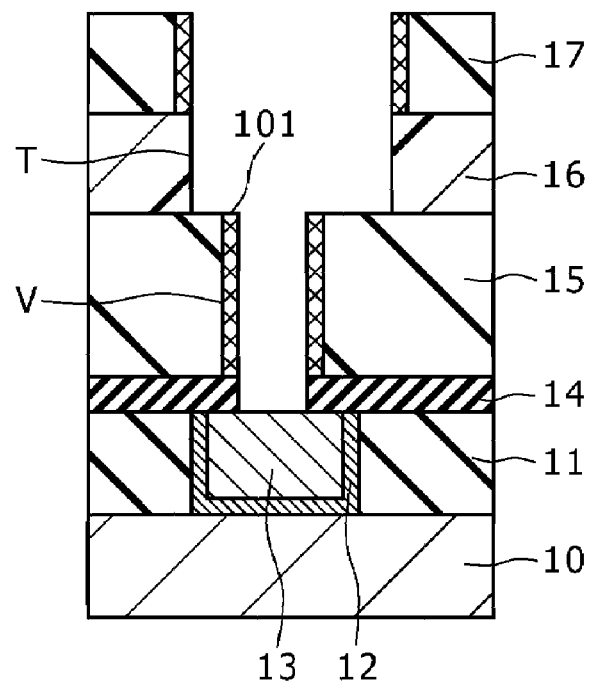

Next, as shown in FIG. 5H, with the cap layer 17 as an etching mask, the second layer insulation film 16 is etched, to form the wiring trench T in the second layer insulation film 16.

By this, the etching for forming the contact hole V in the etching stopper layer 14 and the first layer insulation film 15 and for forming the wiring trench T in the second layer insulation film 16 and the cap layer 17 is finished.

The etching treatments and the plasma treatment shown in FIGS. 5C to 5H can all be carried out in the same apparatus. Since the substrate 10 is never exposed to the atmospheric air, absorption of moisture into the first layer insulation film 15 can be obviated. After the step shown in FIG. 5H, the substrate 10 is taken out of the plasma treatment apparatus, and is conveyed through the atmospheric air into an apparatus for carrying out the subsequent step. In this instance, since the processed surface of the first layer insulation film 15 has already been plasma-treated (see the treated portion 101), absorption of moisture into the first layer insulation film 15 can be prevented from occurring during the conveying step.

Figure 5I:
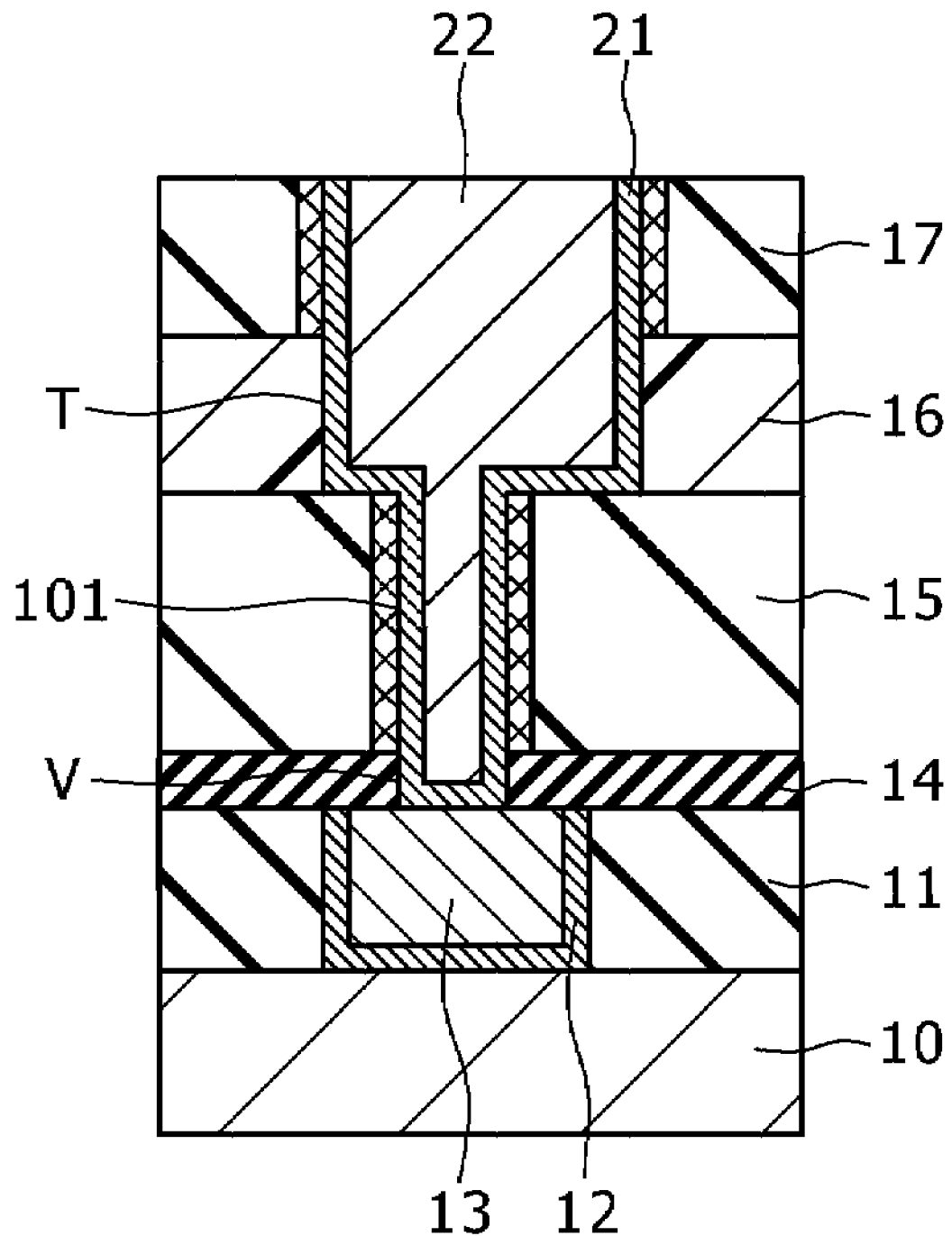

Thereafter, as shown in FIG. 5I, a film of a barrier metal 21 for preventing diffusion of Cu into the layer insulation films 15 and 16 is formed so as to cover the inside walls of the wiring trench T and the contact hole V. The barrier metal 21 may be, for example, a laminate film of TaN and Ta. Then, the wiring trench T and the contact hole V are filled up with a conductive layer 22 formed of Cu, for example. Subsequently, the surplus barrier metal 21 and the surplus conductive layer 22 on the cap layer 17 are removed by a CMP process or the like. The conductive layer 22 in the wiring trench T constitutes an upper layer wiring, while the conductive layer 22 in the contact hole V constitutes a contact for connection between the upper layer wiring and the lower layer wiring 13.

In the method of manufacturing a semiconductor device, if necessary, the steps shown in FIGS. 5B to 5I are repeated, to form a further upper layer wiring or wirings. By the foregoing steps, the semiconductor device is completed.

According to the method of manufacturing a semiconductor device in this embodiment as above-described, by the plasma treatment of side walls of the first layer insulation film 15 composed, for example, of a porous film which is exposed at the time of forming the wiring trench T and the contact hole V, adsorption of water during the conveying through the atmospheric air can be suppressed. As a result, generation of wiring failure in the semiconductor device can be prevented, so that it is possible to manufacture a semiconductor device having an enhanced reliability. Examples of the wiring failure include a lowering in the adhesion due to deterioration of the barrier metal 21 arising from moisture absorption, and the generation of defective burying of Cu. Besides, the prevention of moisture absorption into the first layer insulation film 15 makes it possible to suppress the rise in the dielectric constant of the layer insulation film composed, for example, of a low dielectric constant film.

This ensures that, for example where a low dielectric constant film composed of a porous film is used as the first layer insulation film 15, a dielectric constant extremely close to the value intrinsic of the low dielectric constant film can be maintained, and the capacitance between wirings can be lowered. Since the reliability of the semiconductor device can be maintained notwithstanding the use of the porous film, it is possible to realize device characteristics indicating a higher performance.

Third Embodiment

In a third embodiment, another example of applying the plasma treatment of the first embodiment to a dual Damascene step in the manufacture of a semiconductor device will be described.

First, in the same manner as in the second embodiment, the steps of FIGS. 5A to 5E are carried out.

Figure 6A:
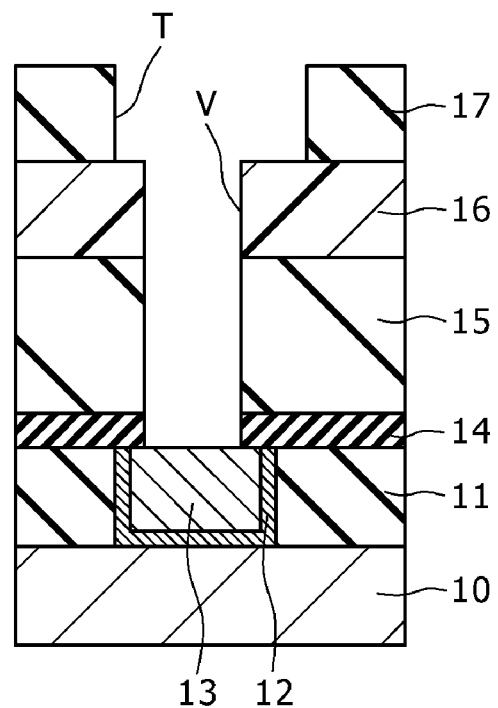
FIGS. 6A and 6E are step sectional diagrams for illustrating a method of manufacturing a semiconductor device according to a third embodiment of the present invention.

Next, as shown in FIG. 6A, the etching stopper layer 14 exposed at the bottom portion of the contact hole V is etched, to form a pattern of the contact hole V in the etching stopper layer 14. Simultaneously with the etching of the etching stopper layer 14 formed of SiC, the first hard mask 18 formed of SiN is etched away.

Figure 6B:
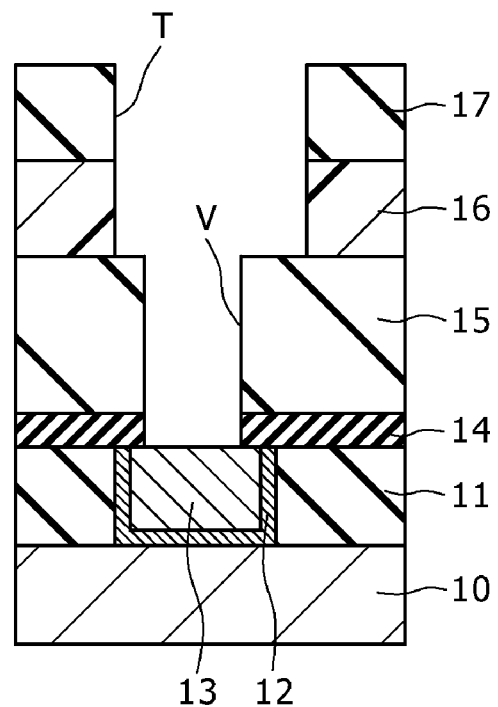

Subsequently, as shown in FIG. 6B, with the cap layer 17 as an etching mask, the second layer insulation film 16 is etched, to form the wiring trench T in the second layer insulation film 16.

Figure 6C:
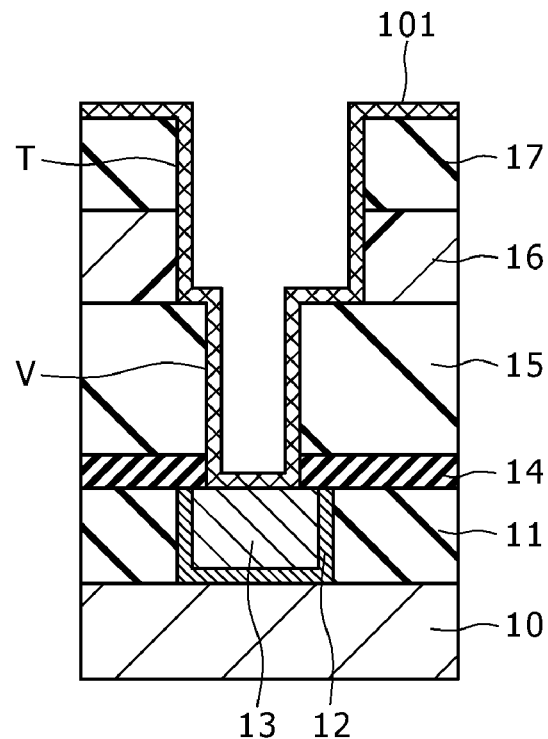

Next, as shown in FIG. 6C, the plasma treatment described in the first embodiment is carried out. By this, C and H are captured by the exposed surfaces of the etching stopper layer 14, the first layer insulation film 15, the second layer insulation film 16, and the cap layer 17. These surfaces are illustrated as the treated portion 101.

The conditions of the plasma treatment are the same as in the second embodiment.

Figure 6D:
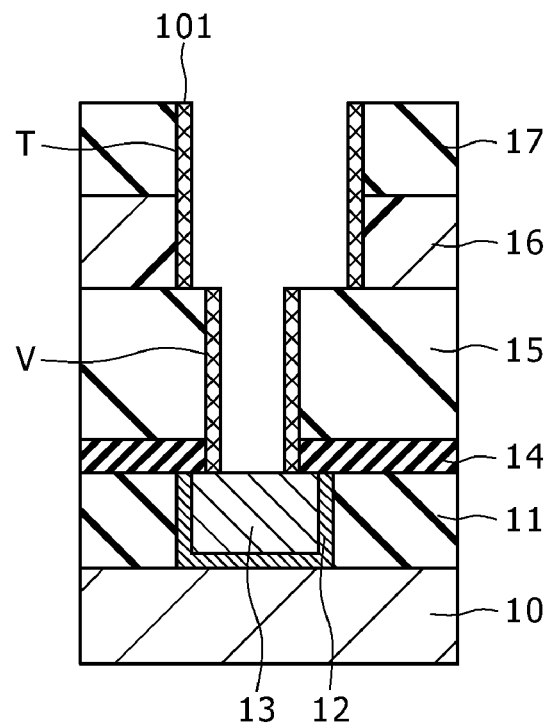

Subsequently, as shown in FIG. 6D, an anisotropic etching is conducted to remove the C and H (treated portion 101) deposited at the bottom portion of the contact hole V by the plasma treatment. By the anisotropic etching, the treated portion 101 is left on the sidewalls of the layer insulation films 15 and 16, whereas the treated portion 101 formed on the upper surfaces of the first layer insulation film 15 and the cap layer 17 is removed. Upon this treatment, C is not left at the bottom portion of the contact hole V, so that electrical connection with the lower layer wiring is made to be favorable.

The etching treatments and the plasma treatment up to the step shown in FIG. 6D can all be carried out in the same apparatus. Since the substrate 10 is not exposed to the atmospheric air, absorption of moisture into the layer insulation films 15 and 16 can be prevented from occurring. After the step shown in FIG. 6D, the substrate 10 is taken out of the plasma treatment apparatus, and is conveyed through the atmospheric air into an apparatus for carrying out the subsequent step. In this case, since the processed surfaces of the layer insulation films 15 and 16 have already been plasma-treated to be the treated portion 101, absorption of moisture into the layer insulation films 15 and 16 can be prevented from occurring during the conveying step.

Figure 6E:
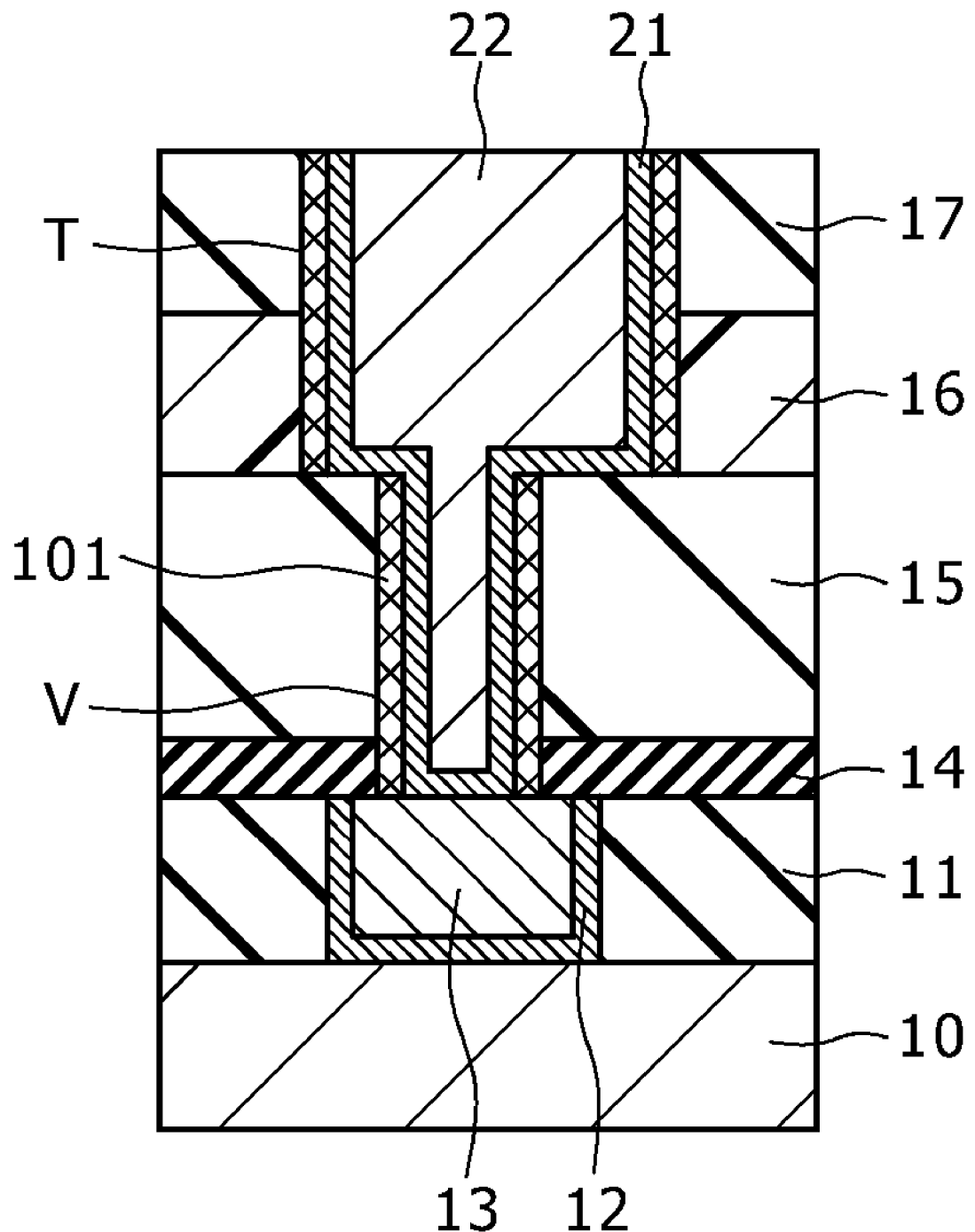

Thereafter, as shown in FIG. 6E, a film of a barrier metal 21 for preventing the diffusion of Cu into the layer insulation films 15 and 16 is formed so as to cover the inside walls of the wiring trench T and the contact hole V. The barrier metal 21 is a laminate film of TaN and Ta, for example. Then, the wiring trench T and the contact hole V are filled up with a conductive layer 22 formed of Cu, for example. Subsequently, the surplus barrier metal 21 and the surplus conductive layer 22 on the cap layer 17 are removed by a CMP process or the like. The conductive layer 22 in the wiring trench T constitutes an upper layer wiring, while the conductive layer 22 in the contact hole V constitutes a contact for connection between the upper layer wiring and the lower layer wiring 13.

In the method of manufacturing a semiconductor device, if necessary, the steps of FIGS. 5B to 6E are repeated, to form a further upper layer wiring or wirings. By the foregoing steps, a semiconductor device is completed.

In the method of manufacturing a semiconductor device according to this embodiment, unlike in the first embodiment, the plasma treatment is conducted after the contact hole V for exposing the lower layer wiring 13 is formed. As a result, the treated portion 101 is left at the side surfaces of all the films that are exposed at the time of formation of the wiring trench T and the contact hole V, for example, the etching stopper layer 14, the first layer insulation film 15, the second layer insulation film 16, and the cap layer 17.

Therefore, absorption of water during the step of conveying through the atmospheric air can be suppressed more securely than in the first embodiment. The effect of the prevention of moisture absorption into the insulation films is the same as described in the first embodiment. In this embodiment, the plasma treatment for removing the treated portion present at the bottom portion of the contact hole V is needed, so that the number of steps is increased, as compared with the first embodiment.

The present invention is not limited to the descriptions of the embodiments above.

For example, the plasma treatment according to these embodiments is applicable to other steps than the dual Damascene step in the manufacture of a semiconductor device. In addition, even in application to the dual Damascene step, the timing of the plasma treatment can be modified variously. Besides, while an exemplary set of plasma treatment conditions have been mentioned in the above embodiments, the conditions are not limited to the above-mentioned.

Furthermore, various other modifications are possible within the scope of the gist of the present invention.

What is claimed is:

1. A plasma treatment method comprising the steps of:
   subjecting an insulation film on a substrate to a plasma treatment using a gas containing at least a CO-based gas;
   rendering a surface of the insulation film with suppressed variations in a dielectric constant of the insulation film and adsorption of water onto the insulation film; and
   forming a conductive layer over the plasma treated insulation film,
   wherein
   said insulating film is a SiOCH film.

2. The plasma treatment method as set forth in claim 1, wherein an RF bias voltage is impressed and ions in a plasma thus produced are led into said substrate, in carrying out said plasma treatment.

3. The plasma treatment method as set forth in claim 1, wherein said plasma treatment is conducted after a treatment of processing said insulation film.

4. The plasma treatment method as set forth in claim 3, wherein said insulation film processing treatment and said insulation film plasma treatment are conducted in the same apparatus.

5. A method of manufacturing a semiconductor device, comprising the steps of:
   forming an insulation film on a substrate;
   forming an opening portion in said insulation film;
   subjecting a surface of said insulation film to a plasma treatment using a gas containing at least a CO-based gas to render the surface with suppressed variations in a dielectric constant of the insulation film and adsorption of water onto the insulation film; and
   forming a conductive layer on said plasma treated insulation film,
   wherein
   said insulating film is a SiOCH film.

* * * * *